United States Patent
Lee et al.

(10) Patent No.: US 7,084,468 B2
(45) Date of Patent: Aug. 1, 2006

(54) HYBRID FERROMAGNET/SEMICONDUCTOR SPIN DEVICE AND FABRICATION METHOD THEROF

(75) Inventors: Woo Young Lee, Seoul (KR); Suk Hee Han, Seoul (KR); Joon Yeon Chang, Seoul (KR); Hi Jung Kim, Seoul (KR); Han Joo Lee, Seoul (KR); Woong Jun Hwang, Seoul (KR); Moo Whan Shin, Seoul (KR); Young Keun Kim, Seoul (KR)

(73) Assignee: Korea Institute of Science and Technology (KR)

( * ) Notice: Subject to any disclaimer, the term of this patent is extended or adjusted under 35 U.S.C. 154(b) by 0 days.

(21) Appl. No.: 10/801,744

(22) Filed: Mar. 15, 2004

(65) Prior Publication Data

US 2004/0178460 A1    Sep. 16, 2004

(30) Foreign Application Priority Data

Mar. 14, 2003    (KR) .................... 10-2003-0016170

(51) Int. Cl.
*G11B 5/39* (2006.01)
(52) U.S. Cl. .................. 257/421; 257/295; 257/75; 324/249; 360/324.1
(58) Field of Classification Search ............ 257/75, 257/295, 421; 324/249; 360/324.1; 365/158, 365/171, 175; 438/3
See application file for complete search history.

(56) References Cited

U.S. PATENT DOCUMENTS 5,465,185 A * 11/1995 Heim et al. ............ 360/324.11
5,654,566 A * 8/1997 Johnson ..................... 257/295
5,962,905 A * 10/1999 Kamiguchi et al. ......... 257/421
6,069,820 A    5/2000 Inomata et al. ............. 365/171
6,876,523 B1 * 4/2005 Takahashi et al. ..... 360/324.11

OTHER PUBLICATIONS

Y.Q. Jia, et al., *Spin-Value Effects in Nickel/Silicon/Nickel Junctions*, IEEE Transactions of Magnetics, vol. 32 (5), Sep. 1996, pp. 4707-4709.
Supriyo Datta et al., *Electronic analog of the electro-optic modulator*, Appl. Phys. Lett. vol. 56(7), Feb. 12, 1990, pp. 665-667.
K.P. Kämper, et al., $CrO_2$ –*A New Half Metallic Ferromagnet?*, Physical Review Letters, vol. 59(24), Dec. 14, 1987, pp. 2788-2791.
Manish Sharma et al., *Spin-dependent tunneling junctions with AlN and AlON barriers*, Appl. Phys. Lett. 77(14), Oct. 2, 2000, pp. 2219-2221.
S.J. Pearton et al., *Advances in wide bandgap materials for semiconductor spintronics*, Materials Science and Engineering R 40(2003) 137-168.
International Search Report dated Dec. 13, 2004.

* cited by examiner

*Primary Examiner*—Thomas L. Dickey
(74) *Attorney, Agent, or Firm*—Ostrolenk, Faber, Gerb & Soffen, LLP

(57) ABSTRACT

Disclosed are a spin injection device applicable as a memory and a logical device using a spin valve effect obtained by injecting a carrier spin-polarized from a ferromagnet into a semiconductor at an ordinary temperature, and a spin-polarized field effect transistor.

10 Claims, 8 Drawing Sheets

HYBRID FERROMAGNET/SEMICONDUCTOR SPIN DEVICE AND FABRICATION METHOD THEROF

BACKGROUND OF THE INVENTION

1. Field of the Invention

The present invention relates to a hybrid ferromagnet/semiconductor spin device.

2. Description of the Conventional Art

Since a transistor replacing a vacuum tube was developed at the Bell laboratory in 1948, an electron device technique based on a complimentary metal oxide semiconductor (CMOS) technique has been greatly developed by the Moore's law (a law that an amount of data that can be stored in a micro chip is increased twice per 18 months). However, due to a technical progress over the past 40 years, a current electron device technique which has faithfully followed the Moore's law is already in a saturated state, and it is anticipated that a device fabrication will be impossible after 20 years since a size of a semiconductor reaches a silicon grating constant (approximately 0.54 nm). According to this, a new next generation device is fast required.

To this end, a development of a metal oxide semiconductor field effect transistor (MOSFET) having a gate of a nano size is being performed in a hurry by deepening the CMOS technique using a nano technique, and a memory and a logical device using a single electron transistor (SET) and a quantum dot are being developed in haste. Also, recently, a thin film transistor using a high molecule was developed thus to prove that several logical circuits can be made by a high molecular thin film. According to this, various molecular electronics devices are being developed by a molecular adjustment. A field of the molecular electronics device is for developing a next generation electronics device using a new material differently from a current electron device technique based on a semiconductor.

So far, in a semiconductor electronics device, only a charge of a carrier (an electron having a negative charge and a hole having a positive charge) has been controlled by an electric field without considering a spin between the charge and the spin, two characteristics of an electron. At the background of a silicon semiconductor industry, some scientists have tried to implement a spin-dependent electron transport. As the result, a new paradigm, a spintronics (a mixed word of a spin and electronics) technique for developing an electronics device by considering the charge of the electron and a degree of freedom the spin is being spotlighted in a recent science technique field. According to this, it is anticipated that the next generation electron device will be greatly developed with a later nano technique development since the spin electron device has characteristics such as an ultra high speed, a ultra low power, and etc. with non-volatility when compared with the conventional electron device.

As a representative example, a reproducing head uses a giant magneto-resistance (GMR) phenomenon generated at a stacked structure between a ferromagnetic metal and a paramagnetic metal and discovered in 1988. The giant magneto-resistance was first discovered in a Fe/Cr multi-layer thin film, and the reason is because a fabrication of a multi-layer thin film of a uniform nano thickness (less than 1 nm) having no defection becomes possible since a ultra high vacuum (UHV) technique advances. The GMR phenomenon was first applied to a substantial device since a spin-valve structure that a magnetization of each magnetic layer is performed freely and independently by inserting a non-magnetic metal layer such as Cu and etc. between two ferromagnetic metal layers was developed.

In case of the spin-valve structure, a thickness of an inserted non-magnetic metal layer is thick enough to remove magnetic defects of two adjacent ferromagnetic metal layers. Thereby, the spin-valve structure can be sensitively reacted to a very small external magnetic field corresponding to several Oe. One of the most conspicuous progresses in the spintronics technique after the GMR discovery is a tunneling phenomenon of a spin-polarized electron (a tunneling magneto-resistance phenomenon) which was observed in a thin film structure of a magnet/insulator/magnet at a high temperature. Even if a low temperature tunneling magneto-resistance phenomenon was discovered approximately 30 years ago, a room temperature tunneling magneto-resistance phenomenon that is very important in an application aspect was discovered in 1995.

The greatest concern of the spintronics research is to implement a memory and a logical transistor by considering a charge and a degree of freedom of a spin at the same time. A research for a spin injection that a spin-polarized electron is injected from a ferromagnetic metal to a paramagnetic metal has been partially performed. It was reported that the spin injection is caused by an interesting phenomenon such as a spin accumulation and etc. In 1993, a bipolar spin transistor was fabricated as a spin switch storage device which has a structure that a paramagnetic metal such as Au is inserted into two ferromagnetic metals, in which a spin is injected into the paramagnetic metal by using one ferromagnetic metal as a spin source and then detecting the injected spin by another ferromagnetic metal. Even though the spin transistor composed of a metal has proved the spin injection phenomenon experimentally, it has a limitation to be used as a memory device due to a small impedance.

SUMMARY OF THE INVENTION

Therefore, an object of the present invention is to provide a spin injection device applicable as a memory and a logical device using a spin valve effect obtained by injecting a carrier spin-polarized from a ferromagnet into a semiconductor at an ordinary temperature, and a fabrication method of a spin-polarized field effect transistor.

To achieve these and other advantages and in accordance with the purpose of the present invention, as embodied and broadly described herein, there is provided a hybrid ferromagnet/semiconductor spin device comprising: a semiconductor substrate; a source region formed on the substrate with a ferromagnet; a spin channel region on the substrate, to which a carrier spin-polarized at the source region is injected; and a drain region formed on the substrate with a ferromagnet, for detecting a spin which has passed through the spin channel region.

The ferromagnet is a magnet metal having a large spin polarization and is one selected from Fe, Co, Ni, FeCo, and NiFe. The ferromagnet can be one selected from magnetic semiconductors such as GaMnAs, InMnAs, GeMn, and GaMnN, and can be a half metal having a spin polarization of 100% such as $CrO_2$. The semiconductor is one selected from Si, GaAs, InAs, and Ge. Also, the spin channel region is Si on insulator (SOI) or two dimensional electron gas of a compound semiconductor.

The source region and the drain region have a different line width of a range of 5–1000 nm each other so that a spin switching is anti-parallel in a certain magnet field range.

An interval between the source region and the drain region is in a range of 10 nm~1 μm.

To achieve these and other advantages and in accordance with the purpose of the present invention, as embodied and broadly described herein, there is also provided a fabrication method of a hybrid ferromagnet/semiconductor spin device comprising the steps of: forming a channel region where a carrier transportation is performed on a semiconductor substrate; etching a surface of the semiconductor substrate of right and left sides of the channel region with a depth of a range of 10–500 nm; forming a source region and a drain region with a ferromagnet at the etched regions of the left and right sides of the channel region; and applying a magnetic field to the ferromagnet source region and the drain region and performing a thermal processing.

A surface of the semiconductor is etched with a depth of a range of 10–500 nm in order to enlarge a contact surface between the semiconductor and the ferromagnet and to facilitate a spin injection, and then a source region and a drain region are formed.

A contact resistance between the ferromagnet and the semiconductor is Ohmic or Schottky. Also, an intermediate film such as $Al_2O_3$ or AlN is inserted between the ferromagnet and the semiconductor with a thickness of a range of 0.5–2 nm thereby to generate a spin injection by a tunneling.

The thermal processing is performed by applying a magnetic field of 0.5–5 kOe in a long axis direction of the ferromagnet at a vacuum state with a temperature of 100–500° C. for 10–60 minutes.

The present invention is a very sensitive device using a ferromagnetic electrode of a nano size, so that a high cleanliness has to be maintained and a step transition has to be performed very fast at the time of a fabrication.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Figure 1:
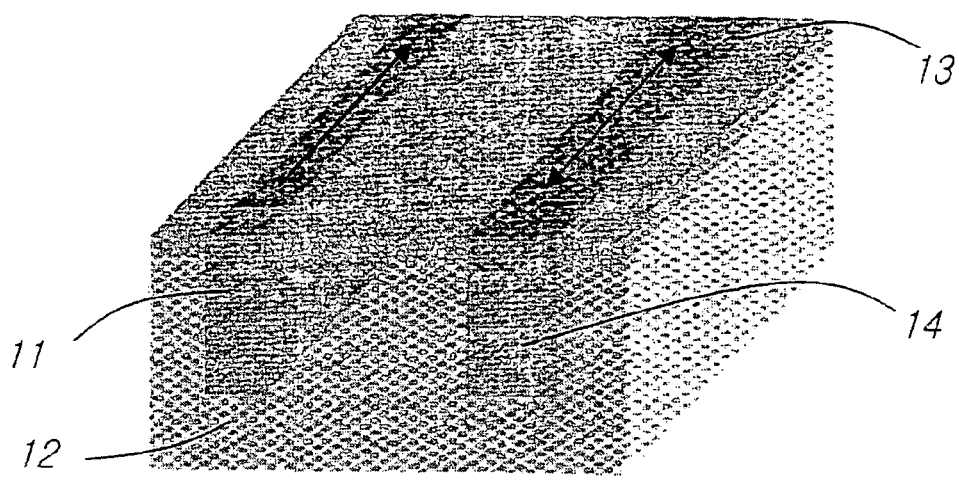
FIG. 1 is a mimetic diagram showing a spin injection device according to the present invention.

Reference will now be made in detail to the preferred embodiments of the present invention, examples of which are illustrated in the accompanying drawings.

A fabrication method and physical characteristics of a ferromagent/semiconductor device according to the present invention will be explained in detail with reference to embodiments.

A N-type silicon wafer was prepared as a substrate. First, a silicon dioxide layer ($SiO_2$) was grown with a thickness of approximately 20 nm by using a thermal oxidation method in order to prevent a leakage current at a silicon interface. After growing the oxidation film, the sample was cut as 11.8×11.8 mm by using a dicing saw.

Before experimenting the prepared sample, a washing operation shown in the following table 1 was performed in order to remove a polluter with an external environment. First, the sample was washed by using TCE, acetone, methanol, and DI water, and then a solvent material and metal remaining on the surface of the sample were completely removed at acidic solution of a high temperature mixed with a ratio of 4:1 ($H_2SO_4:H_2O_2$) for ten minutes. Finally, the sample was washed for ten minutes by using DI water and was dried by using nitrogen gas.

TABLE 1

Washing Process of Silicon Wafer

Solvent Removal

| | |
|---|---|
| 1 | Immerse in boiling trichloroethylene(TCE) for 3 min. |
| 2 | Immerse in boiling acetone for 3 min |
| 3 | Immerse in boiling methyl alcohol for 3 min. |
| 4 | Wash in DI water for 3 min. |

Heavy Metal Clean

| | |
|---|---|
| 1 | Immerse in a solution of $H_2SO_4:H_2O_2$(4:1) for 10 min at a temperature of 120° C. |
| 2 | Quench the solution under running DI water for 1 min. |
| 3 | Wash in running DI water for 10 min. |
| 4 | $N_2$ Blowing. |

After the washing process, an electrode was designed on a mask by using a CAD for an electrode patterning. Line widths of a source and a drain were differentiated from each other as 100 nm and 300 nm in order to obtain a spin valve effect of the electrode by a direction of a magnetic field, and a length thereof was 20 μm. A gap between the two electrodes was in a range of 100 nm–1 μm. The channel length corresponding to the gap was varied in order to certify how a spin electron behaves in silicon. By using the fabricated mask, the electron was patterned with an e-beam exposing device. Differently from a general photolithography, the process was performed by exposing a multi-layer photosensitive film with e-beam using an electron gun controlled by a computer and then developing in a solution of MIBK:IPA (3:1) without using an exposing mask. The multi-layer photosensitive film was formed to have a thickness of 350 nm by performing a free baking at 160° C. for two minutes in order to remove moisture of the silicon substrate, then coating copolymer and 4% of PMMA by using a spin coater, and then performing a soft baking at 170° C. for three minutes.

The reason why the photosensitive film is formed as multi layers not a single layer is in order to form each layer having a different molecular amount, thus to develop a photosensitive film of a lower layer having a less molecular amount more widely, and thus to facilitate a lift-off process after an electrode deposition.

In order to maximize a contact surface between the ferromagnetic electrode and the silicon, the patterned part was etched. The etching process was simultaneously performed for the two layers, the silicon dioxide and the silicon, with different methods. In case of the silicon dioxide, a magnet pole was put into a beaker containing an etching solution at an ordinary temperature by using a buffered oxide etchant (BOE), and then stirred thereby to perform a wet etching of 20 nm. In case of the silicon, an etching was performed by using a reactive ion etcher. Before the etching, mixed gas of oxygen and Ar was used to maintain cleanliness of a reaction chamber thereby to remove a polluter inside the chamber, and a dummy wafer was mounted in the chamber by using $SF_6$ gas used at the time of the etching thereby to form an atmosphere of the chamber. After the previous preparation, the sample was etched by 40 nm and 280 nm under conditions such as a pressure of 100 mtorr, a power of 100 watt, and an $SF_6$ gas flow amount of 20sccm.

After the etching process, a ferromagnetic electrode was deposited by using a DC magnetron sputtering system. Before the deposition, the ferromagnetic electrode was temporarily immersed into a buffered oxide etchant (BOE) solution in order to remove a natural oxidation film generated at the time of a transportation, then was cleanly washed, and was mounted to the vacuum chamber. The reason why the oxidation film was completely removed is in order to smoothly inject and detect the spin electron between the silicon and the electrode. In order to remove a polluter of the chamber, the electrode also maintained an initial vacuum state under $1 \times 10^{-8}$ torr, then a pre-sputtering was performed with $Fe_{16}Co_{84}$ (spin polarization rate: 52%) for about 10 minutes, and then a main deposition for the electrode was performed. At the time of the deposition, a magnet was attached to the electrode in a long axis direction in order to form a magnetization easy axis of the ferromagnetic electrode thereby to deposit 55 nm and 295 nm, respectively. Also, in order to prevent a surface oxidation of the electrode in the air, Ta was stacked with 5 nm on the electrode thereby to form a passivation film. For the deposition of the ferromagnetic electrode, not only the aforementioned sputtering method but also already-known various methods can be applied.

When the deposition of the electrode was completed, the sample was immersed into the container containing acetone for about 24 hours by using a lift-off process in order to completely remove the photosensitive film which was used at the time of the patterning. At this time, the ferromagnetic electrode has a very minute size thereby to require a very careful action not to have a short circuit of the ferromagnetic electrode at the time of the lift-off process.

Figure 2A:
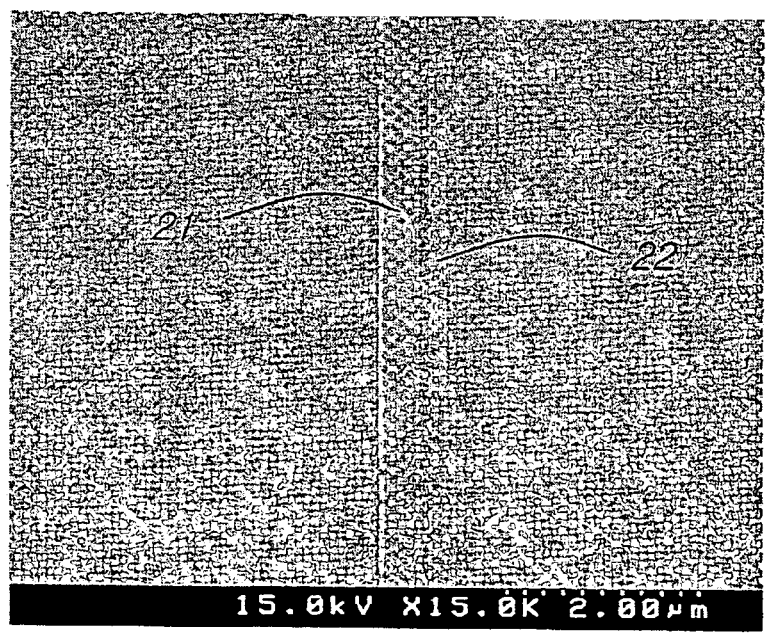
FIGS. 2A and 2B are pictures of substantial spin device and device array fabricated according to the present invention.
Figure 2B:
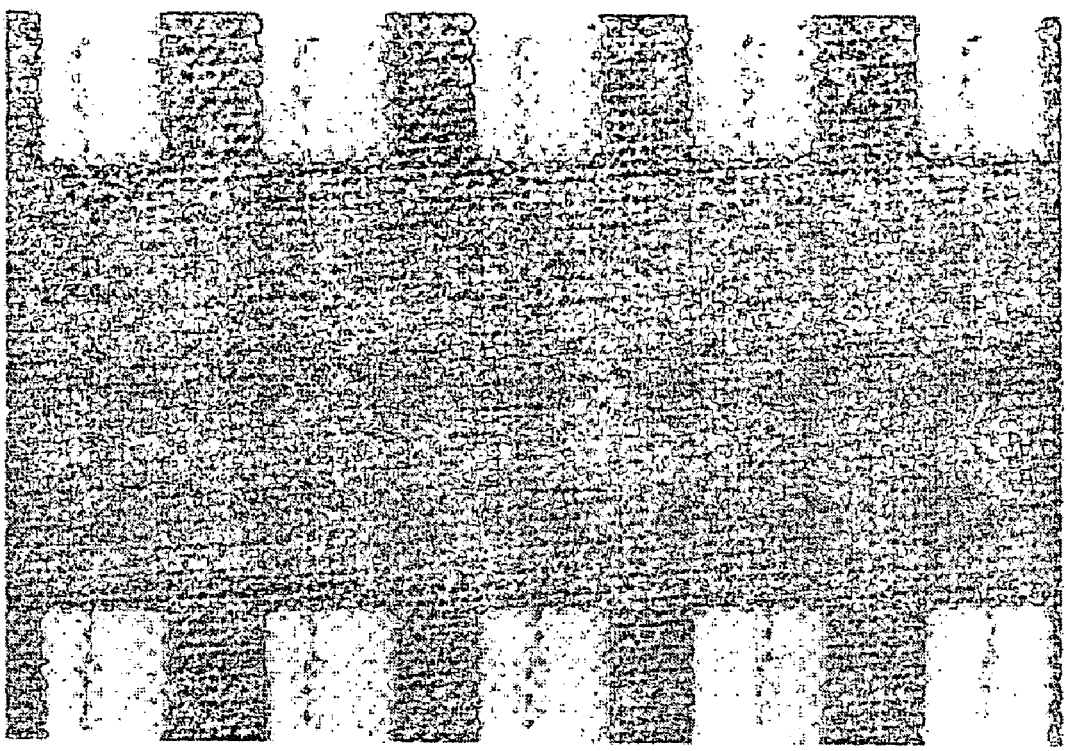

FIG. 1 is a mimetic diagram showing the spin injection device fabricated by said process. An oxidation film 13 is formed on a substrate 12, and a source region 11 and a drain region 14 having a different width are formed. FIGS. 2A and 2B are pictures of a substantial spin device fabricated by said process. Reference numerals 21 and 22 denote a source region and a drain region formed of a ferromagnet, and FIG. 2B shows five sources and drain arrays and a contact pad of Ti/Au.

The implemented device has a very small size thereby not to be able to measure the device directly. Accordingly, a conductor having a very small resistance is fabricated to be sufficiently large thereby to be connected to the electrode for the measurement of the device. To this end, it is important to select a material capable of transmitting a voltage applied at the time of the measurement to the ferromagnetic electrode without an extinction and to design a pad capable of performing an optimum ohmic junction with the electrode. Herein, a selected material is Au. However, when the Au is directly deposited on the silicon substrate, a good junction force between the two materials can not be obtained. Therefore, Ti was deposited. Since a contact pad is formed by using a photo exposing process, a designed pad was fabricated on a glass mask on which a Cr film is formed. A patterning was formed by using a photo exposing device on the sample prepared under optimum conditions (AZ-5214 photosensitive liquid is coated on the sample, then the sample is rotated with 400 rpm in a spin coater, and then the sample is baked for about 15 minutes in an oven of 75° C.) by sensitizing with ultra violet for about 4.5 seconds. Then, the sample was immersed into a developer thus to develop the patterning. The patterned sample was cleanly washed, and then the above-mentioned two materials Ti and Au was deposited by using an e-beam evaporator having an initial vacuum state of $2 \times 10^{-6}$ torr with a thickness of 20 nm and 200 nm, respectively. Then, in order to remove the coated photosensitive liquid for patterning, a lift-off process was performed by using acetone. In doing so, a silicon nano spin device using a spin valve effect was fabricated.

The device provided with two terminals having an ohmic junction according to the present invention can prevent problems which may be generated at a device having a high impedance. A device showing an ohmic behavior by a vertical junction between the ferromagnetic electrode and the silicon was fabricated thus to examine characteristics of a junction.

Figure 3:
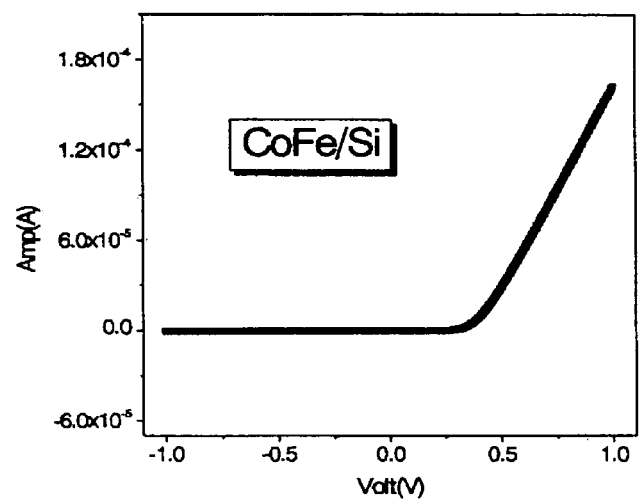
FIG. 3 is a graph showing current and voltage characteristics of CoFe/Si measured to certify a junction characteristic between a ferromagnetic electrode and a semiconductor.

FIG. 3 is a graph showing current and voltage characteristics of CoFe/Si measured to certify a junction characteristic between a ferromagnetic electrode and a semiconductor. As shown, the electrode and the silicon was completely bonded without any polluter with Shottky junction. Also, a Schottky barrier height according to a thermal ion emission due to Schottky barrier was calculated by a following formula.

$$j_{st} = A^* T^2 \exp\frac{-q\,\Phi_b}{kT}$$

Herein, $-q\Phi_b$ is a Schottky barrier height, and $A^*$ is a Richardson constant. By this formula, a Schottky barrier height, 0.49 eV was obtained. In order to certify how a junction surface between the electrode and the silicon influences to current/voltage characteristics in the device, the sample was fabricated by dividing the sample into 60 nm and 350 nm at the time of etching.

Figure 4A:
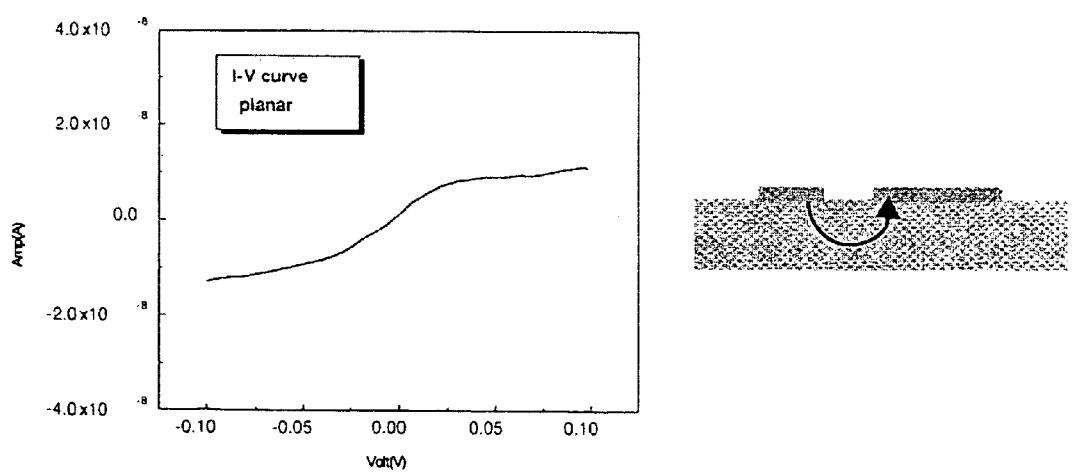
FIGS. 4A to 4C are graphs showing current and voltage characteristics according to a difference in the contact surface between a ferromagnetic electrode and a silicon and mimetic diagrams of a spin transportation.
Figure 4B:
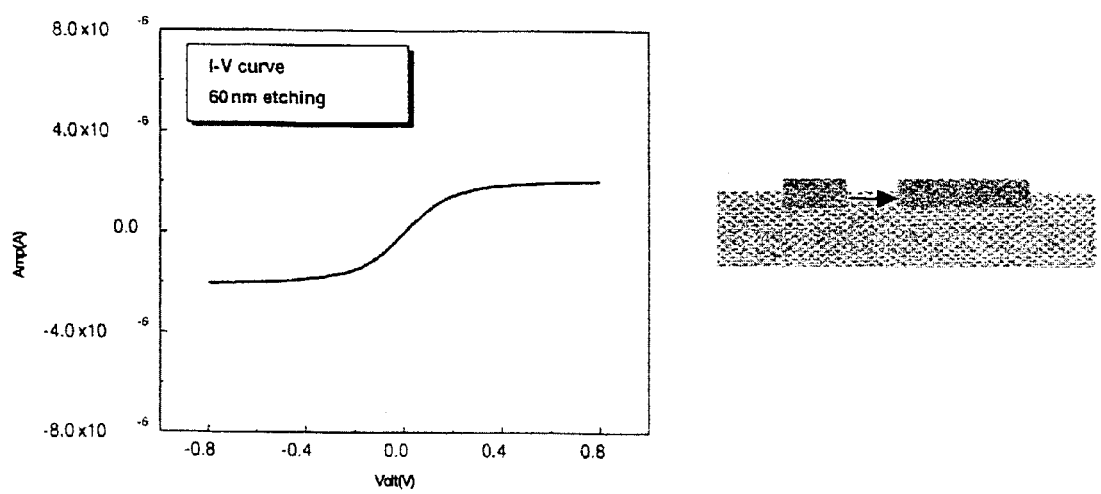
Figure 4C:
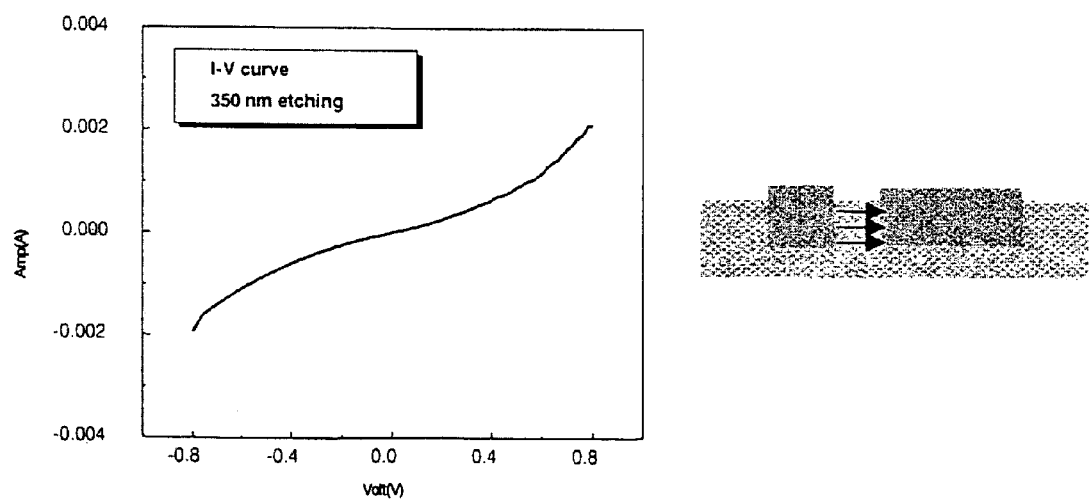

FIGS. 4A and 4C are graphs showing current and voltage characteristics according to a difference of an etched depth of a junction surface between the ferromagnetic electrode and the silicon and mimetic diagrams of a spin transportation. FIG. 4A is a case that the silicon surface was not etched, in which a resistance was measured as several tens of MΩ, and FIG. 4B is a case that the silicon surface was etched as 60 nm, in which a resistance was also greatly measured as several tens of KΩ. However, FIG. 4C is a case that the silicon surface was sufficiently etched as 350 nm, in which a resistance was measured as hundreds of Ω. It could be certified that the resistance was greatly decreased if the junction surface between the ferromagnetic electrode and the silicon was increased. However, performing the etching for a long time may cause a short circuit of the electrode and a pollution of the device by reaction gas, thereby requiring a proper etching condition. A doping concentration and a transportation degree of the silicon which has used as the substrate of the device were obtained by performing a hole measurement.

$$n = -\frac{I_x B_z}{ed\,V_H}$$

$$\mu_n = \frac{I_x L}{en\,V_x Wd}$$

Herein, n denotes an electron concentration, $V_H$ denotes a hole voltage, $\mu_n$ is a transportation degree of an electron. By the above formula, an electron concentration was $7.1 \times 10^{16}$ cm$^{-3}$, a non-resistance was about 5 Ω cm, and a transportation degree of an electron was 948.6 cm$^2$/V-sec.

The resistance variance in the silicon nano spin device according to the present invention means a variance of an electrical signal obtained by injecting an electron spin-polarized at the first ferromagnetic electrode (source) into the silicon, then transporting in the silicon without losing the information, and then detecting from the second electrode (drain) when a magnetic field was applied in a long axis direction of the electrode (that is, a longitudinal direction thereof) and thus to be varied.

Figure 5A:
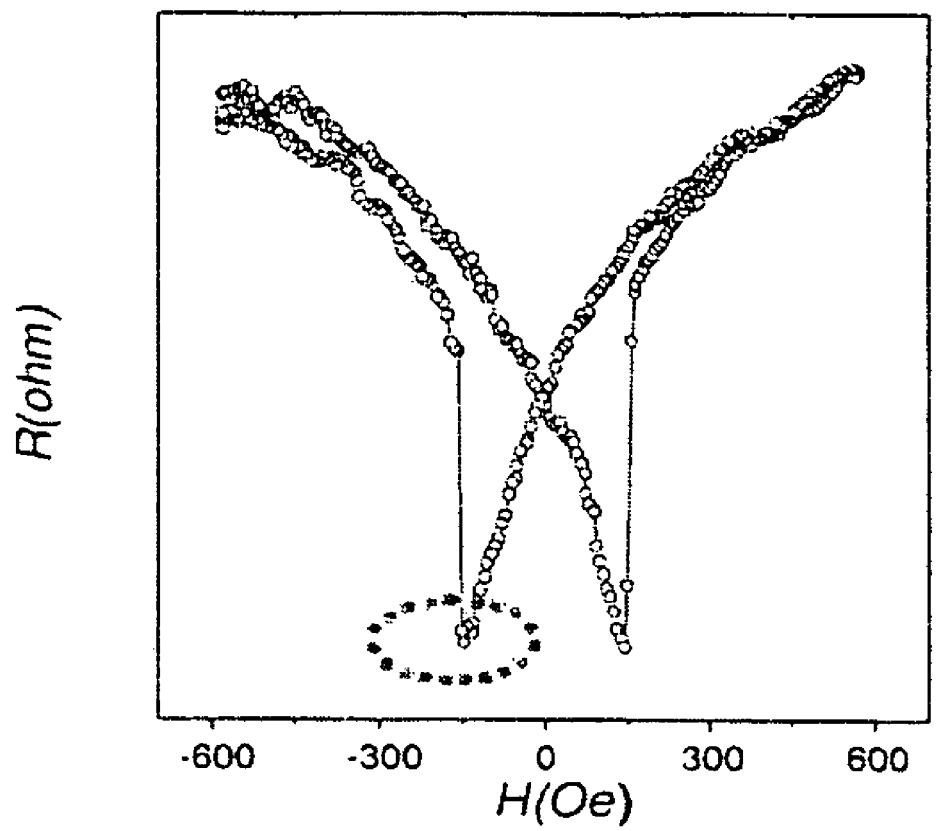
FIGS. 5A and 5B are graphs showing a magneto-resistance variance of a device having a line width of 100 nm and 200 nm and a device of a line width of 100 nm and 300 nm.
Figure 5A:
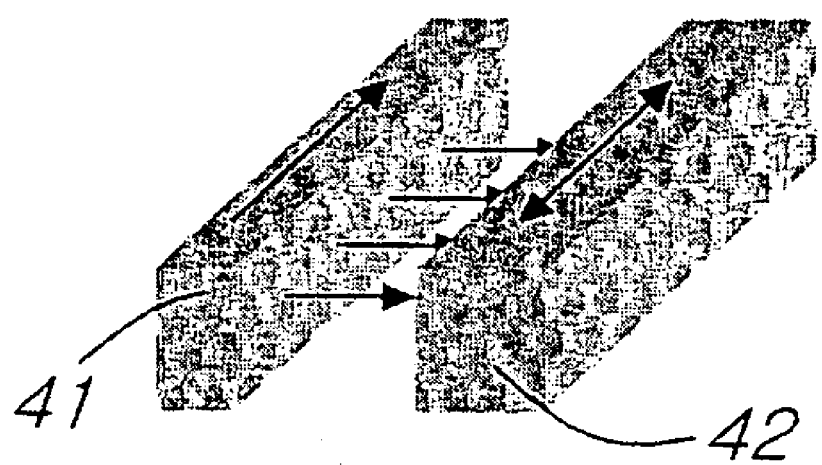
Figure 5B:
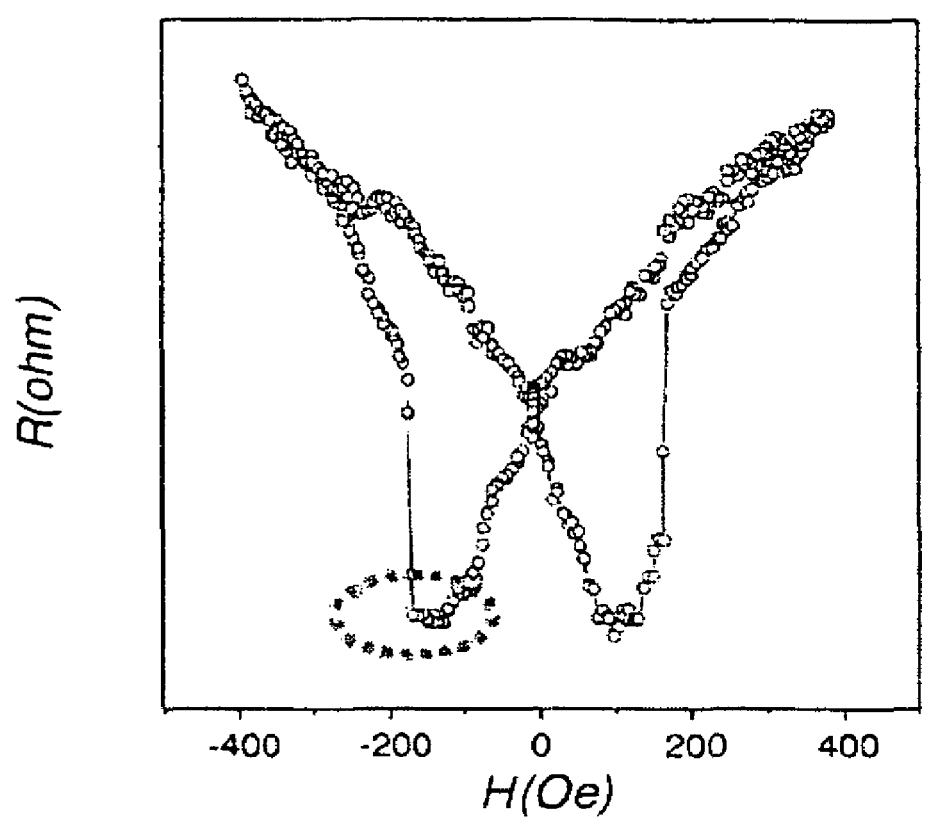
Figure 5B:
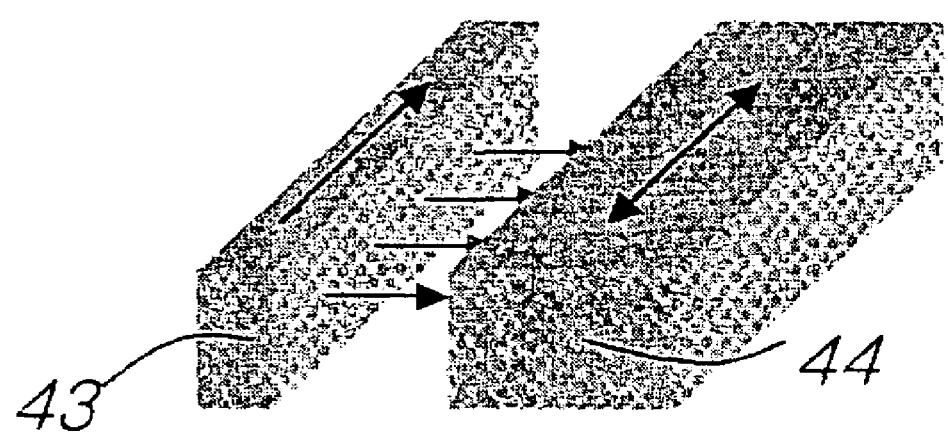

FIGS. 5A and 5B are graphs showing a magneto-resistance variance of a device having a line width of 100 nm and 200 nm and a device of a line width of 100 nm and 300 nm. In case that the line width of the electrode was 100 nm (41) and 200 nm (42), a section that magnetization directions of two electrodes are anti-parallel was considerably short (FIG. 5A). On the contrary, in case that the line width of the electrode was 100 nm (43) and 300 nm (44), a section that magnetization directions of two electrodes are anti-parallel was considerably long as several tens of Oe (FIG. 5B). Said results show that a coercivity due to a shape magnetic anisotropy of the electrode having the line width of 300 nm is less than that of the electrode having the smaller line width and thereby the electrode having the line width of 300 nm has a greater switching effect. Accordingly, a spin valve effect was certified at an room temperature in the spin device fabricated according to the present invention.

Figure 6:
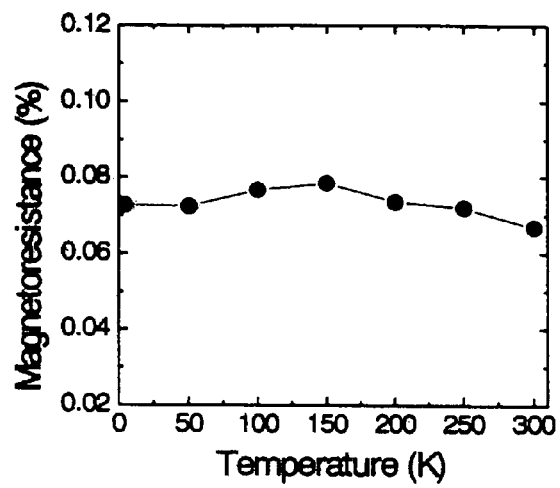
FIG. 6 is a graph showing a relation between a magneto-resistance and a temperature in 4–300 K.

FIG. 6 is a graph showing a relation between a magneto-resistance and a temperature in 4–300 K. The magneto-resistance of the spin device according to the present invention was obtained by a following formula.

$$\Delta R = R_H - R_{H=O}/R_{H=O}$$

Referring to FIG. 6, the magneto-resistance according to the temperature was scarcely varied and the magneto-resistance of approximately 0.1% was maintained until the high temperature.

Figure 7:
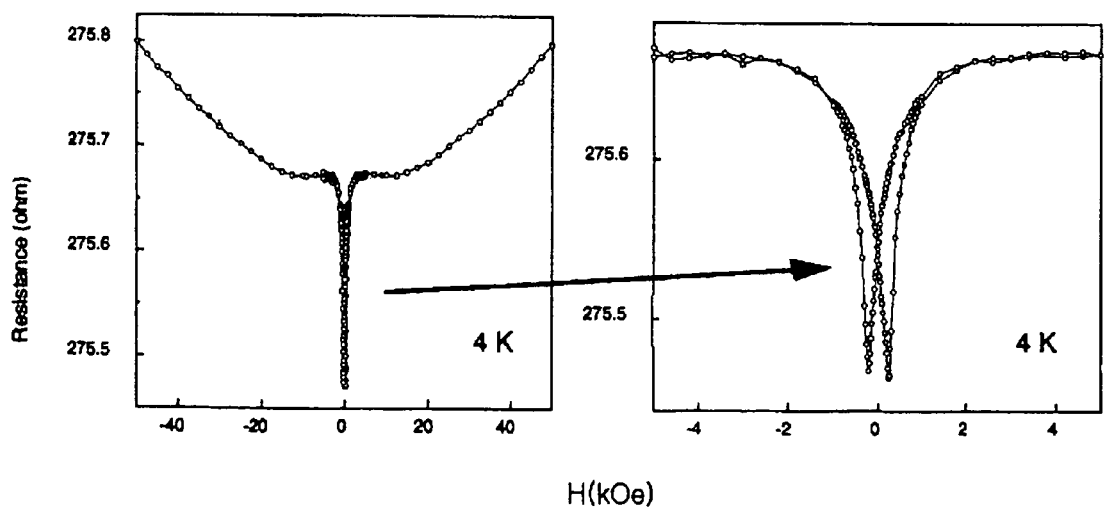
FIG. 7 is a graph showing a variance of a magneto-resistance curve according to a magnetic field measure in 4 K.

FIG. 7 is a graph showing a variance of a magneto-resistance curve according to a magnetic field measure in 4 K. Referring to FIG. 7, in a range of a high magnetic field (approximately 20 kOe), the stronger an intensity of a magnetic field becomes, a variance of a magneto-resistance by the silicon is shown. This is regarded as a result of a typical Lorentz force certifying that the electron behaves in the silicon.

Figure 8:
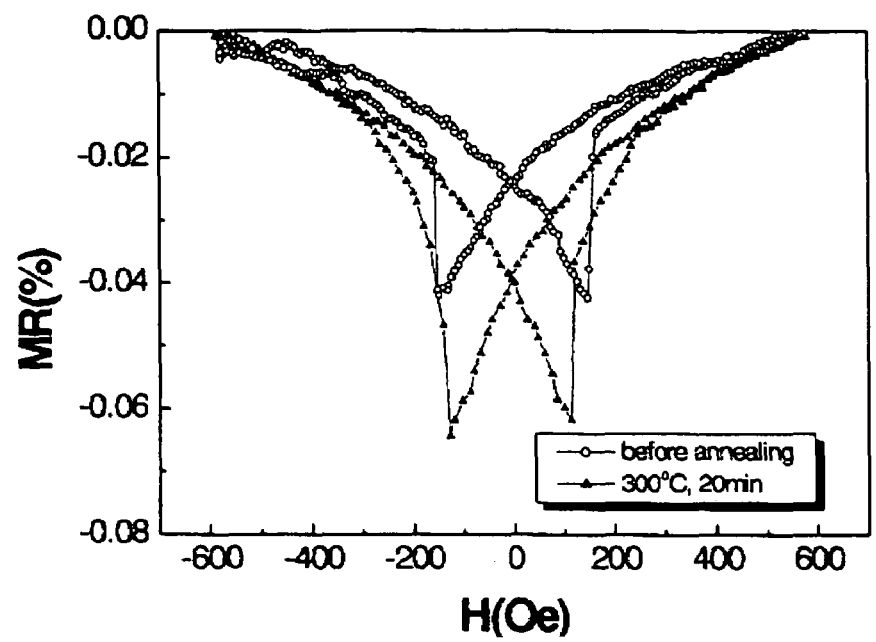
FIG. 8 is a graph showing a variance of a magneto-resistance according to a magnetic field before and after a thermal processing.

FIG. 8 is a graph showing a variance of a magneto-resistance according to a magnetic field before and after a thermal processing. Since the ferromagnetic electrode deposited by a sputtering method has a defect in the electrode, an improved magneto-resistance could be obtained after a thermal process. In the preferred embodiment, a magnetic field of approximately 600 Oe was applied in a long axis direction of the electrode and at the same time, a thermal processing was performed at a vacuum state of $1 \times 10^{-6}$ torr with a temperature of 300° C. for 20 minutes. After the thermal processing, an improved magneto-resistance by approximately 80% can be observed. This is because the defect inside the ferromagnetic electrode has a stable magnetic domain due to the thermal processing.

Figure 9:
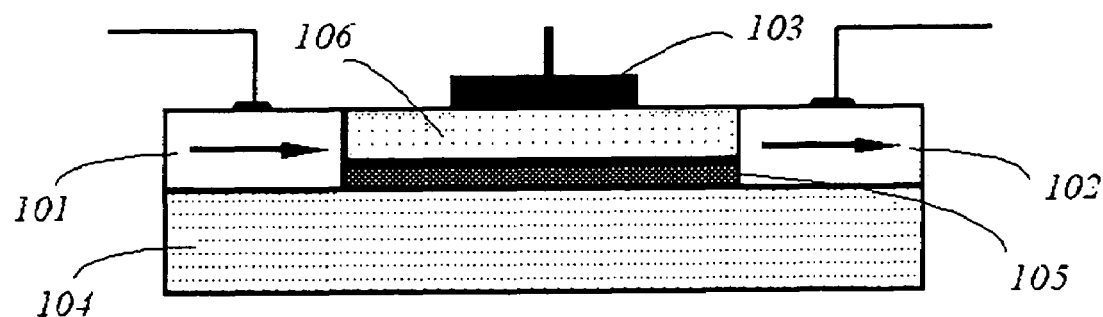
FIG. 9 is a sectional view showing a structure of a spin-polarized field effect transistor (spin FET).

A spin transistor was illustrated in FIG. 9 as one embodiment of the hybrid ferromagnet/semiconductor device which was fabricated according to the present invention. A ferromagnet was used as a source 101 and a drain 102 of the spin transistor. A spin-polarized carrier is injected into a channel region 105 from the source 101 and is detected from the drain 102. As the channel region, a two-dimensional electron gas layer of a compound semiconductor can be used. In this case, the carrier injected into the channel region can be controlled by using a resistance variance due to an external magnetic field. Also, a precession of the spin-polarized carrier which has been injected into the channel region can be controlled by a gate 103. By this method, a spin-polarized field effect transistor (a spin FET) is implemented. Reference numerals 104 and 106 denote a barrier layer (an insulating layer) of a quantum well structure.

In the hybrid ferromagnet/semiconductor device according to the present invention, differently from the conventional semiconductor transistor where only a charge of the carrier was controlled by an electric field, the spin is injected into the source and detected from the drain by using the ferromagnet. According to this, the present invention can be applied as a memory and a logical device using the spin of the carrier.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. A hybrid ferromagnet/semiconductor spin device comprising:
    a semiconductor substrate;
    a source region formed on the substrate as a ferromagnet;
    a spin channel region on the substrate, where a spin-polarized caner at the source region is injected and transported;
    a drain region formed on the substrate as a ferromagnet, for detecting a spin which has passed through the spin channel region; and
    wherein a surface of the semiconductor substrate where the source region and the drain region are formed is etched with a depth of a range of 10–500 nm.

2. The hybrid ferromagnet/semiconductor spin device of claim 1, wherein the ferromagnet is one selected from GaMnAs, InMnAs, GeMn, and GaMnN.

3. The hybrid ferromagnet/semiconductor spin device of claim 2, wherein the ferromagnet is a magnet metal having a great spin polarization.

4. The hybrid ferromagnet/semiconductor spin device of claim 2, wherein the ferromagnet is a half metal having a spin polarization of 100%.

5. The hybrid ferromagnet/semiconductor spin device of claim 2, wherein the semiconductor is one selected from Si, GaAs, InAs, and Ge.

6. The hybrid ferromagnet/semiconductor spin device of claim 2, wherein the spin channel region is Si on insulator (SOI) or two dimensional electron gas of a compound semiconductor.

7. The hybrid ferromagnet/semiconductor spin device of claim 2, wherein the source region and the drain region have a line width of a range of 5–1000 nm.

8. The hybrid ferromagnet/semiconductor spin device of claim 7, wherein an interval between the source region and the drain region is in a range of 10 nm–1 μm.

9. The hybrid ferromagnet/semiconductor spin device of claim 7, wherein the source region and the drain region have a different line width each other so that a spin switching is anti-parallel in a certain magnet field range.

10. The hybrid ferromagnet/semiconductor spin device of claim 2, wherein a contact resistance between the ferromagnet and the semiconductor is Ohmic or Schottky.

* * * * *